United States Patent [19]

Selwyn

[11] Patent Number: 5,849,135
[45] Date of Patent: Dec. 15, 1998

[54] PARTICULATE CONTAMINATION REMOVAL FROM WAFERS USING PLASMAS AND MECHANICAL AGITATION

[75] Inventor: Gary S. Selwyn, Los Alamos, N. Mex.

[73] Assignee: The Regents of the University of California, Los Alamos, N. Mex.

[21] Appl. No.: 614,110

[22] Filed: Mar. 12, 1996

[51] Int. Cl.$^6$ ...................................................... H05H 1/00
[52] U.S. Cl. .............................. 156/345; 134/1.1; 134/1.2
[58] Field of Search ................................ 156/345, 643.1; 216/67, 71; 118/723 R, 723 E; 204/298.06, 298.07, 298.33, 298.34; 134/1.1, 1.2, 1.3

[56] References Cited

U.S. PATENT DOCUMENTS

| | | | |
|---|---|---|---|
| 5,298,720 | 3/1994 | Cuomo | 219/121.43 |
| 5,387,777 | 2/1995 | Bennett et al. | 156/345 X |
| 5,531,862 | 7/1996 | Otsubo et al. | 156/643.1 |

OTHER PUBLICATIONS

John Goree and G.S. Selwyn, "Dusty Plasmas in the Cosmos and in Chip Manufacture," *Physics News in 1994* (eds. Phillip F. Schewe and Ben P. Stein, American Institute of Physics, College Park, MD), pp. 59–61 (1994).

Anatolii D. Zimon, *Adhesion of Dust and Powder* (Plenum Press, New York, 1969), pp. 181–183.

J. Goree, "Charging of Particles In a Plasma," Plasma Sources Sci. & Techno., 3,400 (1994).

Gary S. Selwyn, . "A Phenomenlogical Study of Particulates In Plasma Tools and Processes," Jpn. J. Appl. Phys. 32, 3068 (1993).

Gary S. Selwyn, "Pump/Purge Procedure Using Neon Feedstock," IBM Technical Disclosure Bull., 34, 237 (1992).

Gary S. Selwyn, "Plasma Particulate Contamination Control: 1. Transport and Process Effects," J. Vac. Sci. Technol. B 9 (6), 3487 (1991).

*Primary Examiner*—Thi Dang
*Attorney, Agent, or Firm*—Samuel M. Freund

[57] ABSTRACT

Particulate contamination removal from wafers using plasmas and mechanical agitation. The present invention includes the use of plasmas with mechanical agitation for removing particulate matter from the surface of a wafer. The apparatus hereof comprises a mechanical activator, at least one conducting contact pin for transferring the vibration from the activator to the wafer, clamp fingers that maintain the wafer's position, and means for generating a plasma in the vicinity of the surface of the wafer, all parts of the cleaning apparatus except the mechanical activator and part of the contact pin being contained inside the processing chamber. By exposing a wafer to a plasma and providing motion thereto in a direction perpendicular to its surface, the bonding between the particulate matter and the surface may be overcome. Once free of the wafer surface, the particulates become charged by electrons from the plasma and are drawn into the plasma by attractive forces which keep them from redepositing. The introduction of a flowing gas through the plasma sweeps the particulates away from the wafer and out of the plasma. The entire surface is cleaned during one cleaning step. The use of an rf plasma to accomplish the particulate removal was found to remove more than 90% of the particulates.

22 Claims, 4 Drawing Sheets

PARTICULATE CONTAMINATION REMOVAL FROM WAFERS USING PLASMAS AND MECHANICAL AGITATION

The invention was made with government support under Contract No. W-7405-ENG-36 awarded by the U.S. Department of Energy to The Regents of The University of California. The government has certain rights in this invention.

FIELD OF THE INVENTION

The present invention relates generally to the cleaning of semiconductor wafers and, more particularly, to the cleaning of wafers by simultaneously establishing a flowing gas plasma in the vicinity of the wafer surface and mechanically vibrating the wafer.

BACKGROUND OF THE INVENTION

Particulate contamination on semiconductor surfaces can generate significant complications during device fabrication. That is, particles can cause defects in the resulting devices leading to yield loss, and may also reduce the reliability of operating devices. A particle smaller than about 0.5 $\mu$m can cause a chip to fail. Because of this, attention has been paid to maintaining high standards of cleanliness during manufacture of integrated circuits. However, clean room technology has evolved to a level such that particle deposition onto wafers from exposure to the clean room is only a minor source of wafer contamination, accounting for only 5–15% of the total number of particles deposited onto a wafer during processing. Rather, as much as 90% of the contamination found on wafers derives from the process tools. Plasma processing, used in 35–45% of the steps required to fabricate a dynamic memory chip, generates high levels of particulate contamination due to 1) electrical charging by electron attachment in the plasma followed by transport of the charged particles due to plasma electrical forces (See, e.g., John Goree and G. S. Selwyn, "Dusty Plasmas in the Cosmos and in Chip Manufacture," *Physics News in* 1994 (eds. Phillip F. Schewe and Ben P. Stein, American Institute of Physics, College Park, Md.), pp. 59–61 (1994)), and 2) particle generation due to material flaking from chamber walls and homogeneous nucleation processes. Thus, wafers must be cleaned before, during or after many of the processing steps they must undergo to become a device. Cleaning accounts for approximately 30% of the processing performed on a modern fabrication line.

Prior inventions have dealt primarily with developing means of eliminating particles from plasma tools. For example, U.S. Pat. No. 5,298,720 for "Method And Apparatus For Contamination Control In Processing Apparatus Containing Voltage Driven Electrode," which issued to Jerome J. Cuomo et al. on Mar. 29, 1994, teaches the use of specially designed grooves in the rf electrode of the plasma tool leading from the wafer to the pump port. Such grooves are designed to intentionally create localized "hot spots" that attract and thereby drain particles away from the wafer during particle suspension in the plasma. This reduces particle deposition onto the wafer (which occurs after shutdown of the plasma) by depleting the concentration of particles suspended during the process. Other methods include shutting down the plasma by gradually decreasing the applied radiofrequency power. This has the effect of minimizing the lateral electrical forces that confine particles in the plasma. The use of oscillating magnetic fields has also been described for particle removal from plasmas. A changing magnetic field induces a force on the particle which can influence its transport.

Although present technology seeks to minimize particle accumulation and growth in the plasma, particle deposition still occurs on wafers due to the mechanical handling of the wafer, turbulence in load-lock chambers of the process tools, and particles resident on the wafer from previous steps. Methods of purging particles from the plasma processes themselves have no effect on these sources of particles. Moreover, since plasma-generated particles are known to primarily affect wafers at the completion of a plasma process, a post-process cleaning is indicated. That is, wafers must be cleaned immediately prior to, and after a plasma process.

Particle removal technology commonly in use requires the application of solvents and deionized water rinses. This consumes substantial quantities of water, and the particle level of the rinse is critical to the quality of the process. As a result, it is difficult to re-use the solvents and solvent water quality must be constantly monitored. The use of such "wet processes" is also incompatible with vacuum technology currently required for many process steps, including plasma processing. Wafers must be removed from the vacuum tool and remounted in the wet cleaner. This makes it impossible to clean a wafer within the process chamber.

Other methods of wafer cleaning include the use of supercritical carbon dioxide, where the wafer is placed in a vessel pressurized to 10,000 psi with $CO_2$. At this pressure, carbon dioxide becomes a supercritical fluid and has the ability to dissolve organic films and to remove particles from surfaces. However, this process has limited throughput and the high pressures can destroy device structures as well as posing a safety hazard.

Lasers have been used to remove particles from surfaces. In one approach, the surface is lightly moistened with water vapor, and a high-power, pulsed laser is used to rapidly vaporize the surface-adsorbed water, carrying off particles. The particles are then entrained in a stream of nitrogen or air to remove them from the wafer. This approach also suffers from low throughput, as the laser must be rastered across the wafer. Moreover, the laser energy can damage photoresist and thin metal lines. It is unclear whether the laser approach can be used to remove particle contamination residing inside of device circuits. Such circuits can be as small as 0.35 $\mu$m and as deep as 1–2 $\mu$m. Particles inside these narrow structures are likely to be difficult to remove using laser excitation and vaporization removal methods. The laser approach is also difficult to incorporate into a process tool, since it requires step-and-repeat capability for moving the wafer and optics for focusing the laser energy onto the wafer surface. The use of an air stream to entrain the particles is also incompatible with a vacuum process.

A fourth approach to wafer cleaning involves the use of high-pressure, adiabatically expanded carbon dioxide or argon gas. The Joule-Thompson effect, resulting from the rapid expansion of the compressed gas, causes solid particles of $CO_2$ or Ar, respectively, to form. This flux of particles is then directed onto the surface of the wafer to remove particles by energy transfer collisions. Unfortunately, this approach is also incompatible with vacuum processes, is subject to particle redeposition onto the wafer, and the chilled temperature of the expanded gas (less than −100° C.) can stress a wafer, freeze photoresists and lead to thermal expansion problems.

Accordingly, it is an object of the present invention to provide an apparatus and method for cleaning semiconductor wafers, prior to and after each process fabrication step, which does not damage the wafer, which is compatible with vacuum processing, and which does not generate waste materials.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the method for removing particulate matter from the surface of a wafer may include the steps of: forming a plasma at a chosen voltage in the vicinity of the surface of the wafer, wherein a plasma sheath is formed at a chosen distance above the wafer such that the surface thereof is bombarded by positive ions and electrons from the plasma, thereby inhibiting the buildup of charge thereon; inducing vibrations in the wafer such that the particulate matter is caused to move away from the surface of the wafer and into the plasma sheath, the separated particulate matter then being exposed to electron bombardment from the plasma, thereby attaining a negative charge such that it passes into the plasma; and purging the particulate matter from the plasma.

Preferably, the plasma is an rf plasma.

In a further embodiment of the invention, in accordance with its objects and purposes the apparatus for removing particulate matter from the surface of a wafer may include: means for generating a plasma in the vicinity of the surface of the wafer, wherein a plasma sheath is formed at a chosen distance above the wafer such that the surface thereof is bombarded by positive ions and electrons from the plasma, thereby inhibiting the buildup of charge thereon; means for inducing vibrations in the wafer such that the particulate matter is caused to move away from the surface of the wafer and into the plasma sheath, the separated particulate matter then being exposed to electron bombardment from the plasma, thereby attaining a negative charge such that it passes into the plasma; and means for removing the particulate matter from the plasma.

It is preferred that the plasma is an rf plasma.

Benefits and advantages of the present invention include the removal of particulate material from the surface of a wafer using an inexpensive, dry, nonpolluting, in situ, non-contact process. The entire surface is treated with one cleaning step.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings.

DETAILED DESCRIPTION

Briefly, the present invention includes the use of plasmas and mechanical agitation for removing particulate matter from the surface of a wafer. The apparatus hereof comprises a mechanical activator, at least one conducting contact pin for transferring the vibration from the activator to the wafer, clamp fingers that maintain the wafer's position, and means for generating a plasma in the vicinity of the surface of the wafer, all parts of the cleaning apparatus except the mechanical activator and part of the contact pin being contained inside the processing chamber. By exposing a wafer to a plasma and providing motion thereto in a direction perpendicular to its surface, the bonding between the particulate matter and the surface may be overcome. Once free of the wafer surface the particulates become charged by electrons (about $10^4$ electrons on a 1 $\mu$m particle) from the plasma, and are drawn into the plasma by attractive forces which keeps them from redepositing. The introduction of a flowing gas through the plasma sweeps the particulates away from the wafer and out of the plasma. The entire surface is cleaned during one cleaning step. The use of an rf plasma to accomplish the particulate removal was found to remove more than 90% of the particulates.

Figure 1:
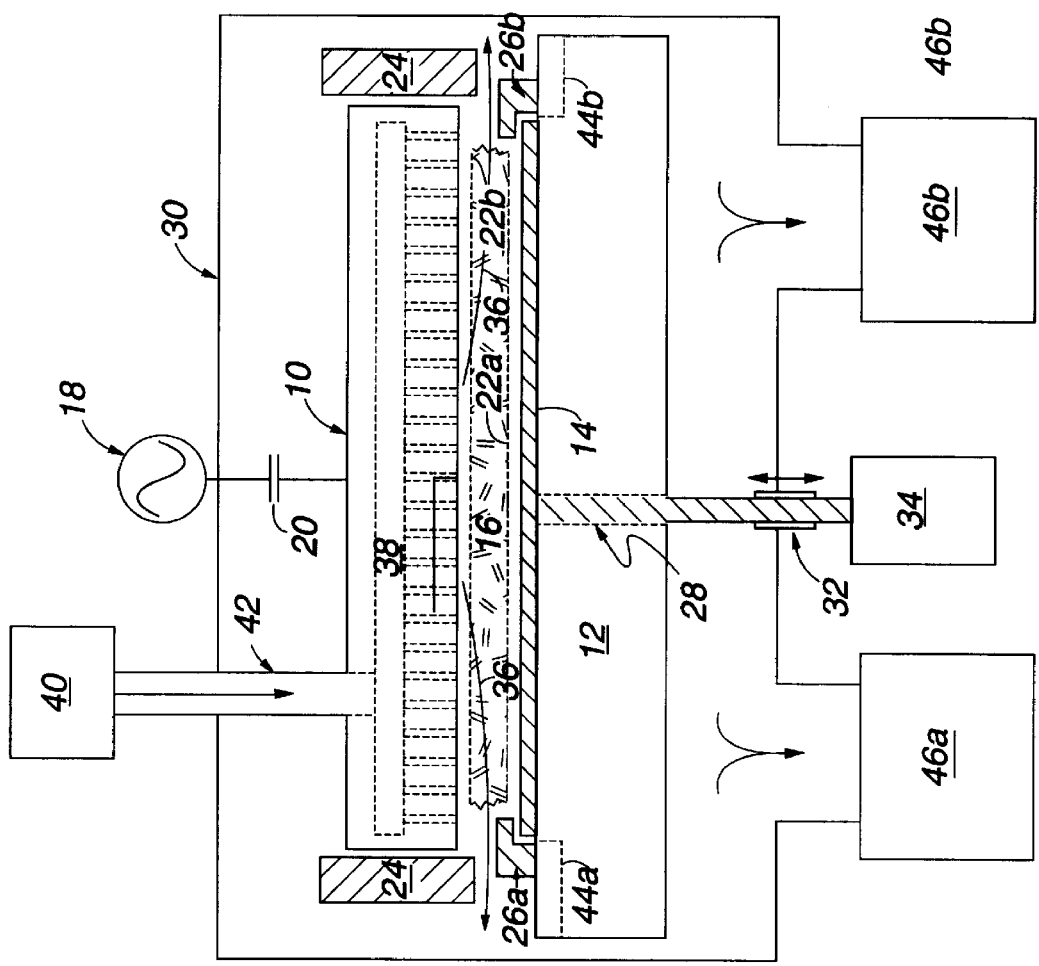
FIG. 1 is a schematic side view of the apparatus of the present invention.

Reference will now be made in detail to the present preferred embodiments of the invention, examples of which are illustrated in the accompanying drawings. Similar or identical structure is identified with identical callouts. Turning now to FIG. 1, a schematic side view of the apparatus of the present invention is illustrated. Shown in cross section are rf electrode, 10, which is spaced-apart (about 15 mm) from and generally parallel to ground electrode, 12, on which rests wafer, 14, which is to be cleansed of particulate matter. Typical wafer dimensions in the semiconductor industry are 0.6–1 mm thick and 125–300 mm in diameter. Plasma, 16, is established and sustained between electrodes 10 and 12 when rf energy is applied to electrode 10 by means of rf power source, 18, through capacitor, 20. Its boundaries, 22a and 22b, called the plasma sheath, are located above wafer 14 and below electrode 10. Circular shapes for electrodes 10 and 12 have been found to be most convenient, although other shapes might be employed. Plasma voltages employed were between 50 and 1000 V at 13.56 MHz. Three hundred wafts of power were dissipated in the discharge with 5 torr of helium. It should be mentioned that other types of plasma discharges may also perform this function. Annular ground shield, 24, which surrounds electrode 10 reduces the spread of plasma 16 away from the surface of wafer 14. Clamps, 26a and 26b, prevent wafer 14 from having significant motion either perpendicular or parallel to the surface of electrode 12, but allow some motion in both of these directions and ground the wafer, as will be described in more detail hereinbelow. Wafer 14 is caused to vibrate at about 10 kHz by electrically conducting post, 28, which passes through the walls of vacuum chamber, 30, which houses the electrode structure, with the aid of vacuum feedthrough, 32. Post 28 is driven by mechanical vibrator, 34. In an alternate embodiment of the present invention, piezoelectric or acoustic-coupling means may be used for wafer agitation. A gas flow, 36, radial to electrode 10, is provided by gas diffuser/showerhead, 38, where gas from gas source, 40, is introduced by inlet tube, 42, at a flow rate between 10 and 500 sccm. It is preferred that noble gases such as helium or neon be used. It is necessary that the post be conducting so that the wafer 14 maintains the same potential as electrode 12. Radial channels, 44a and 44b, are formed in electrode 12 to provide preferred electrical pathways for the plasma as will also be described in more detail hereinbelow. Preferably, these channels have a width and depth between 0.5 and 4 times the thickness of the plasma sheath. Vacuum pumps, 46a and 46b, permit vacuum chamber 30 to be operated at 1–10 torr while the radial gas flow from showerhead 38 is generated.

Figure 2:
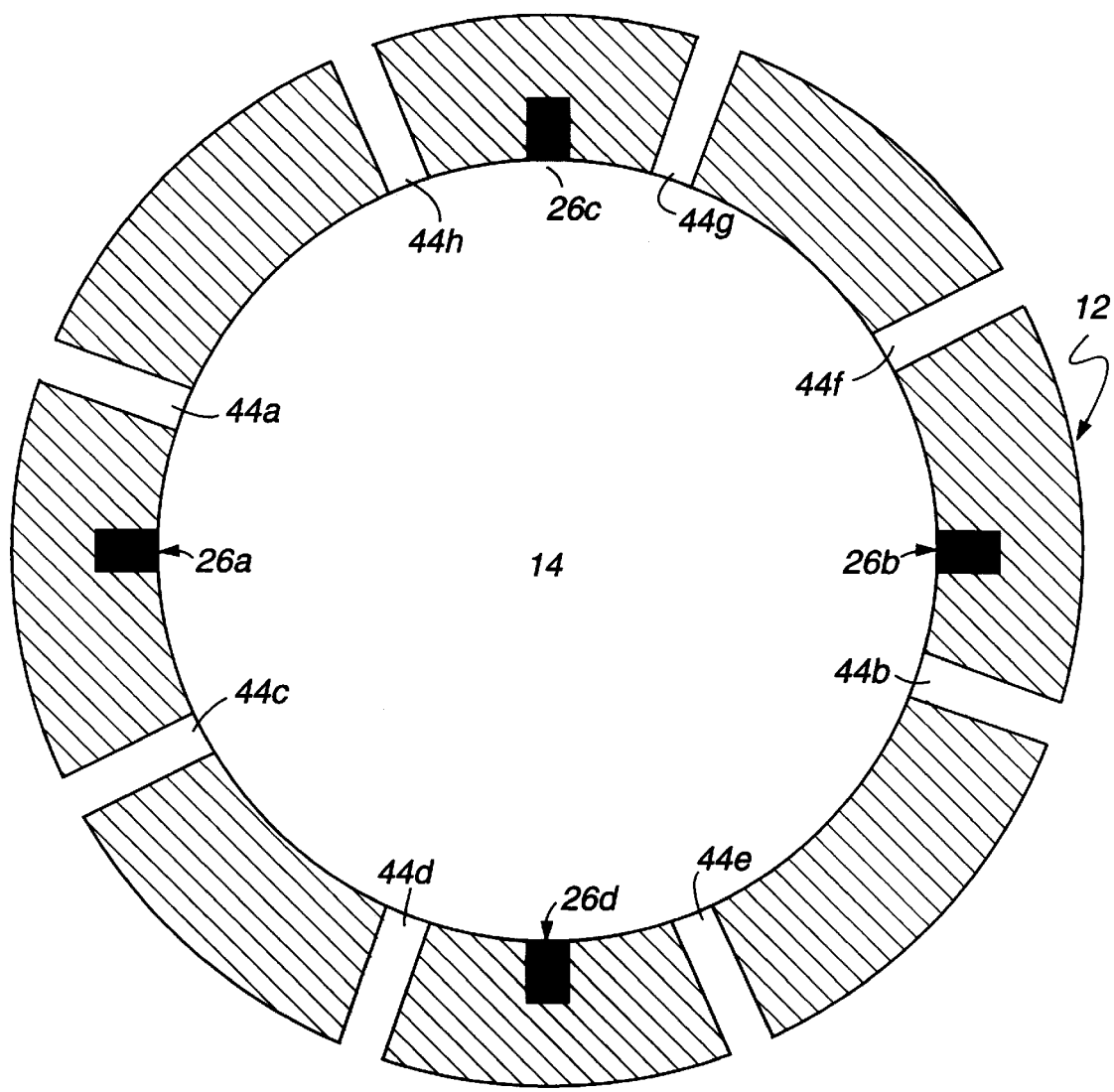
FIG. 2 illustrates a schematic, top view of the ground electrode of the present apparatus, as illustrated in FIG. 1, hereof, showing the relationship among the clamps, the preferred electrical pathways, the ground electrode and the wafer.

FIG. 2 illustrates a schematic, top view of ground electrode 12 of the present apparatus, as illustrated in FIG. 1 hereof, showing the relationship among radial channels 44a–h, clamps 26a–d, and wafer 14.

Particles adhere to surfaces because of Coulombic forces (electrical attraction), van der Waals forces (chemical bonds), and capillary forces (surface tension) should any liquid phase be present. All grounded surfaces exposed to radio-frequency plasmas are flooded with a flux of ions and electrons that reduce the intensity of the Coulombic forces present between charged particles and the surface to be cleaned. That is, the exposure of the surface to ions and electrons overcomes the tendency of the surface to acquire an image charge, and thus the electrical binding force is significantly reduced by the plasma. In *Adhesion of Dust and Powder*, by Anatolii D. Zimon (Plenum Press, New York, 1969), pp. 181–183, the author shows that the electrical force binding particles to a surface is reduced in the presence of ionized air.

Reducing Coulombic forces alone, however, provides only minimal removal of contaminating particles. To reduce van der Waals forces, the apparatus of the present invention vibrates the surface to be cleaned by applying strong vertical acceleration. During this mechanical activation, the wafer is also exposed to the plasma which acts to reduce Coulombic forces. Care must be taken in applying the vibrational excitation to the wafer, since vibrational nodes occur in regular patterns across the surface of the wafer which inhibit particulate removal. In particular, locations where the clamp fingers hold the wafer in place present difficulties.

Particle adhesion to the surface of a wafer is also caused by capillary forces, which can be especially strong. In the practice of the present invention, any moisture present on a wafer vaporizes during exposure to the vacuum required in order to support the plasma. High vacuum, however, is not required. Rather, the plasma may be maintained between 1 and 10 torr of pressure, which is sufficient to remove any traces of water present at room temperature.

Once the bond between the particle and the wafer being treated is sufficiently reduced in strength, mechanical vibrations of the wafer cause particles to be lifted 0.05–0.5 mm above the wafer, breaking electrical contact of the particles to the wafer. When this occurs, all such particles become negatively charged by the action of electron from the plasma colliding therewith (See, e.g., "Charging Of Particles In A Plasma," by J. Goree, Plasma Sources Sci. & Tehnol., 3, 400 (1994). The agitation must only lift the particles a small distance (approximately one Debye length (<0.1 mm)) for the van der Waals forces to be overcome, for the particles to enter the sheath, and for the charging process to begin. Then, electrical forces present in the plasma/sheath system continue to move the charged particles away from the edge of the sheath boundary, which may range from 0.5–7 mm above the surface of the wafer, depending on the electron density of the plasma, the electron temperature, the operating pressure, and the plasma chemistry, and into the plasma proper. That is, the particles begin to acquire a charge once they are within the sheath, and the repulsive, time-averaged, electric field of the sheath (the high-field region of the plasma) then pushes the charged particles into the electropositive (attractive) portion of the plasma and farther from the wafer surface. Strong drag forces generated by a high gas flow rate of high viscosity gases such as helium or neon at pressures of 1–10 torr, combined with the specialized trapping fields created by the plasma, drive the particulates out of the plasma and into the pump ports of the processing chamber. (See, e.g., "A Phenomenlogical Study Of Particulates In Plasma Tools And Processes," by Gary S. Selwyn, Jpn. J. Appl. Phys. 32, 3068 (1993), Cuomo et al., supra, and "Pump/Purge Procedure Using Neon Feedstock," by Gary S. Selwyn, IBM Technical Disclosure Bull., 34, 237 (1992). The use of grooves in the grounded electrode for creating favored electrical pathways (See, Cuomo et al., supra) has been found to improve the particulate removal by about 20%. The plasma is also compressed by the vertical motion of the wafer under the action of the conducting pin. This causes the plasma to expand out of the confines of the electrodes, further assisting in removing particles from the vicinity of the wafer surface. Helium is an excellent choice for the process gas since it is light and therefore does not damage the wafer by etching or other processes, and since it has a high viscosity which is effective in the removal of the particulates. Thus, particles leaving the surface of the wafer are prevented from recontaminating the wafer. During the cleaning process, the wafer is not removed or exposed to air. This is especially important for particulates which become hygroscopic or corrosive when exposed to air and moisture. The cleaning time for a wafer having any chosen size is less than 10 s when processed according to the teachings of the present invention, the entire wafer surface being cleaned in one cleaning step. It should be mentioned that, although the efficiency of wet cleaning technologies decreases for feature sizes below about 0.5 $\mu$m because of the effects of surface tension, the present invention is well-suited to cleaning such features since it uses a vertical flux of ions and electrons in the cleaning process, such electrons and ions having been used to etch the fine features in the first place.

Figure 3:
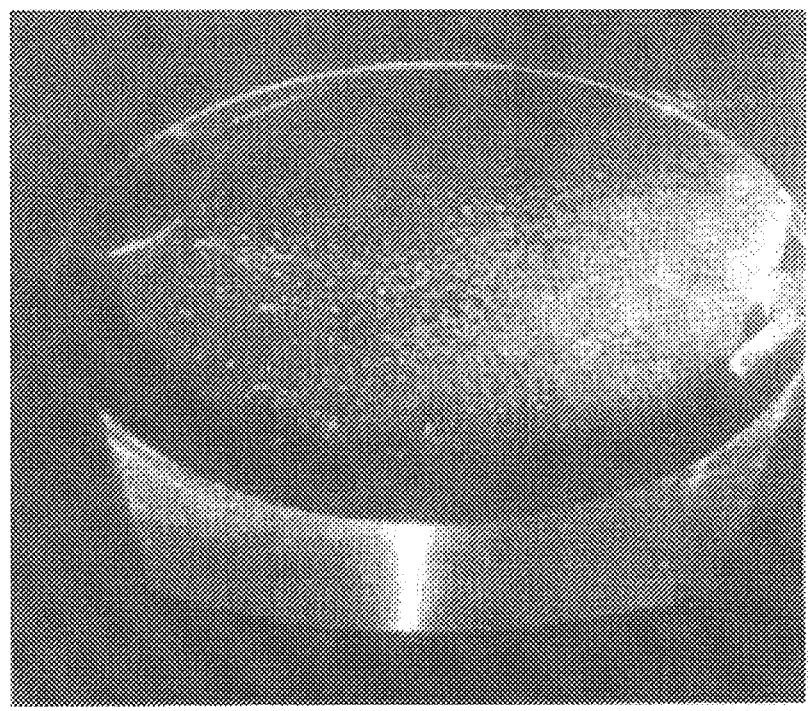
FIG. 3 is a photograph of a semiconductor wafer covered with particulates having sizes ranging between 0.5 and 500 $\mu$m which are obliquely illuminated with visible light in order to render the particles visible.

FIG. 3 is a photograph of a semiconductor wafer covered with particulates having sizes ranging between 0.5 and 500 $\mu$m which are obliquely illuminated with visible light in order to render the particles visible. To date, quantitative particulate counting has not been performed. Therefore, the greater than 90% particulate reduction as a result of processing according to the teachings of the present invention is an estimate.

Figure 4:
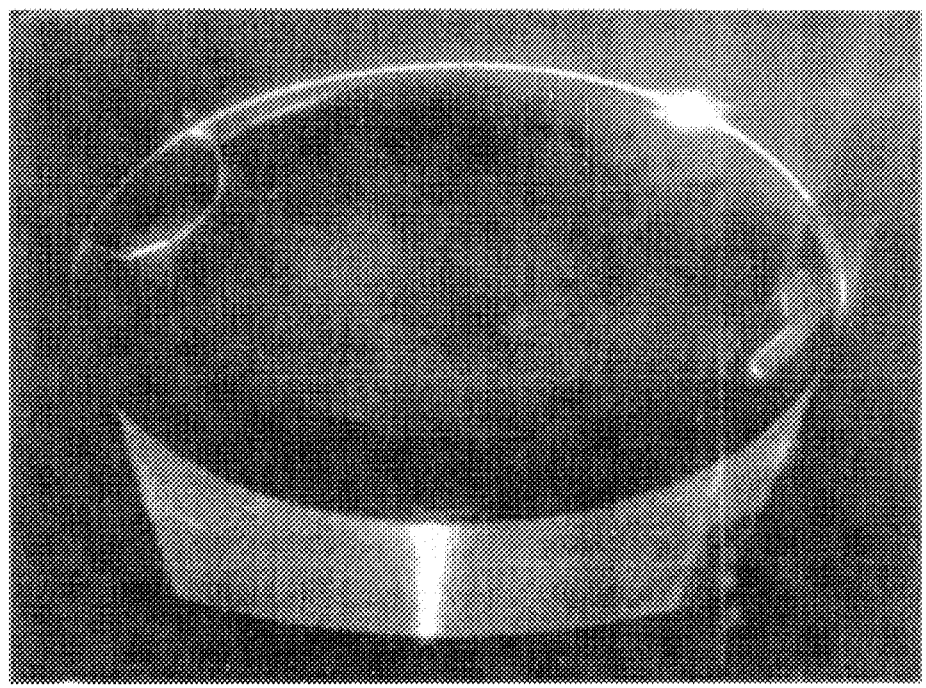
FIG. 4 is a photograph of the semiconductor wafer shown in FIG. 3, hereof, after processing according to the teachings of the present invention.

FIG. 4 is a photograph of the semiconductor wafer shown in FIG. 3, hereof, after processing according to the teachings of the present invention. A small reduction in particulate concentration (i.e., <30%) has been observed if the wafer is agitated with no plasma being present. No reduction in particulate concentration was observed (i.e., <10%) when the plasma is present, but the wafer does not undergo vibration.

Following the cleaning process, and with the lifted and suspended particles purged, the plasma is then extinguished and the gas flow stopped. At this point the wafer may be removed from the vacuum chamber, or may then subsequently be processed by a surface modification plasma such as that used for etching, deposition or sputtering. A wafer may be cleaned immediately prior to, or after a process step.

The foregoing description of the invention has been presented for purposes of illustration and description and is not intended to be exhaustive or to limit the invention to the precise form disclosed, and obviously many modifications and variations are possible in light of the above teaching. For example, it is believed that pulsing the plasma will be effective for removing particles suspended in the plasma after the wafer is processed according to the teachings of the present invention. It is likewise expected that radio frequency power "ramp down", photophoretic control induced by the use of high power lasers, and microwave-driven, standing waves applied to the plasma, will be useful for removing such particles (See, e.g., Gary S. Selwyn, "Plasma Particulate Contamination Control: 1. Transport And Process Effects," J. Vac. Sci. Technol. B 9 (6), 3487 (1991)).

The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A process for removing particulate matter from the surface of a wafer, comprising the steps of:
   a. forming a plasma at a chosen voltage in the vicinity of the surface of the wafer, wherein a plasma sheath is formed at a chosen distance above the wafer such that the surface thereof is bombarded by positive ions and electrons from the plasma, thereby inhibiting the buildup of charge thereon;
   b. inducing vibrations in the wafer such that the particulate matter is caused to move away from the surface of the wafer and into the plasma sheath, the separated particulate matter then being exposed to electron bombardment from the plasma, thereby attaining a negative charge such that it passes into the plasma; and
   c. purging the particulate matter from the plasma.

2. The process for removing particulate matter from the surface of a wafer as described in claim 1, wherein said step of purging the particulate matter includes the use of a flowing gas to sweep the particulate matter from the plasma.

3. The process for removing particulate matter from the surface of a wafer as described in claim 1, wherein said step of purging the particulate matter includes creating favored electrical pathways for the charged particulate matter.

4. The process for removing particulate matter from the surface of a wafer as described in claim 2, wherein the flowing gas includes noble gases.

5. The process for removing particulate matter from the surface of a wafer as described in claim 2, wherein the flow rate of the flowing gas is 10–500 sccm.

6. The process for removing particulate matter from the surface of a wafer as described in claim 1, wherein said process occurs in a vacuum chamber at a pressure of 1–10 torr.

7. The process for removing particulate matter from the surface of a wafer as described in claim 1, wherein the plasma is an rf plasma.

8. The process for removing particulate matter from the surface of a wafer as described in claim 7, wherein the rf plasma is generated at between 50 and 1000 V.

9. The process for removing particulate matter from the surface of a wafer as described in claim 2, wherein during said step of purging the particulate matter the chosen voltage of the plasma is reduced.

10. An apparatus for removing particulate matter from the surface of a wafer, comprising in combination:

a. a planar, grounded electrode for supporting the wafer;
   b. a planar, second electrode, spaced apart from said grounded electrode and parallel thereto;
   c. means for applying a voltage to said second electrode such that a plasma is formed in the vicinity of the surface of said wafer, wherein a plasma sheath is formed at a chosen distance above said wafer and having a chosen thickness such that the surface thereof is bombarded by positive ions and electrons from the plasma, thereby inhibiting the buildup of charge thereon;
   d. means for inducing vibrations in the wafer such that the particulate matter is caused to move away from the surface of the wafer and into the plasma sheath, the separated particulate matter then being exposed to electron bombardment from the plasma, thereby attaining a negative charge such that it passes into the plasma; and
   e. means for removing the particulate matter from the plasma.

11. The apparatus for removing particulate matter from the surface of a wafer as described in claim 10, wherein said means for applying a voltage to said second electrode includes an rf voltage source.

12. The apparatus for removing particulate matter from the surface of a wafer as described in claim 10, wherein said means for removing the particulate matter from the plasma includes means for flowing a gas through the plasma in order to sweep the particulate matter therefrom.

13. The apparatus for removing particulate matter from the surface of a wafer as described in claim 10, wherein said means for removing the particulate matter from the plasma includes a plurality of radial grooves in said ground electrode, forming thereby favored electrical pathways for the charged particulate matter.

14. The apparatus for removing particulate matter from the surface of a wafer as described in claim 13, wherein the radial grooves have a width between 0.5 and 4 times the thickness of the sheath, and a depth of between 0.5 and 4 times the thickness of the sheath.

15. The apparatus for removing particulate matter from the surface of a wafer as described in claim 10, wherein said means for inducing vibrations in the wafer includes mechanical means.

16. The apparatus for removing particulate matter from the surface of a wafer as described in claim 10, further comprising means for holding said wafer in place on said grounded electrode.

17. An apparatus for removing particulate matter from the surface of a wafer, comprising in combination:

(a) means for generating a plasma in the vicinity of the surface of the wafer, wherein a plasma sheath is formed at a chosen distance above the wafer having a chosen thickness such that the surface thereof is bombarded by positive ions and electrons from the plasma, thereby inhibiting the buildup of charge thereon;
   (b) a planar, electrically conducting support for the wafer;
   (c) means for inducing vibrations in said electrically conducting support for the wafer such that the wafer is caused to vibrate, and particulate matter thereon is caused to move away from the surface of the wafer and into the plasma sheath, the separated particulate matter then being exposed to electron bombardment from the plasma, thereby attaining a negative charge such that it passes into the plasma; and
   (d) means for removing the particulate matter from the plasma comprising a plurality of radial grooves in said electrically conducting wafer support, forming thereby favored electrical pathways for the charged particulate matter.

18. The apparatus for removing particulate matter from the surface of a wafer as described in claim 17, wherein said means for generating said plasma includes rf means.

19. The apparatus for removing particulate matter from the surface of a wafer as described in claim 17, wherein said means for removing the particulate matter from the plasma includes means for flowing a gas through the plasma in order to sweep the particulate matter therefrom.

20. The apparatus for removing particulate matter from the surface of a wafer as described in claim 17, wherein the radial grooves in said electrically conducting wafer support have a width between 0.5 and 4 times the thickness of the sheath, and a depth of between 0.5 and 4 times the thickness of the sheath.

21. The apparatus for removing particulate matter from the surface of a wafer as described in claim 17, wherein said means for inducing vibrations in the wafer includes mechanical means.

22. The apparatus for removing particulate matter from the surface of a wafer as described in claim 17, further comprising means for holding said wafer in place on said electrically conducting wafer support.

\* \* \* \* \*